US005620907A

United States Patent [19]
Jalali-Farahani et al.

[11] Patent Number: 5,620,907
[45] Date of Patent: Apr. 15, 1997

[54] METHOD FOR MAKING A HETEROJUNCTION BIPOLAR TRANSISTOR

[75] Inventors: Bahram Jalali-Farahani, Los Angeles, Calif.; Clifford A. King, New York, N.Y.

[73] Assignee: Lucent Technologies Inc., Murray Hill, N.J.

[21] Appl. No.: 610,646

[22] Filed: Mar. 4, 1996

Related U.S. Application Data

[63] Continuation-in-part of Ser. No. 419,627, Apr. 10, 1995, abandoned.

[60] Provisional application No. 60/008,514 Dec. 12, 1995.

[51] Int. Cl.[6] .................................................. H01L 21/265
[52] U.S. Cl. ..................... 438/320; 257/200; 438/489; 438/532; 438/555
[58] Field of Search .......................... 437/26, 31, 33, 437/126, 131; 148/DIG. 72; 257/200

[56] References Cited

U.S. PATENT DOCUMENTS

| | | | |
|---|---|---|---|
| 5,010,026 | 4/1991 | Gomi | 437/31 |
| 5,106,767 | 4/1992 | Comfort et al. | 437/31 |
| 5,250,448 | 10/1993 | Hamasaki et al. | 437/31 |
| 5,252,143 | 10/1993 | Chiang et al. | 148/33 |
| 5,273,930 | 12/1993 | Steele et al. | 437/89 |
| 5,296,391 | 3/1994 | Sato et al. | 437/31 |
| 5,340,753 | 8/1994 | Bassous et al. | 437/31 |
| 5,356,821 | 10/1994 | Naruse et al. | 437/34 |
| 5,399,511 | 3/1995 | Taka et al. | 437/31 |

FOREIGN PATENT DOCUMENTS

| | | |
|---|---|---|
| 2719464 | 12/1978 | European Pat. Off. . |
| 0390521 | 3/1990 | European Pat. Off. . |

OTHER PUBLICATIONS

Kamins et al., "Small–Geometry . . . Bipolar Transistors", IEEE Elec. Devic. Lett., vol. 10, No. 11, Nov. 1989.
Kroemer, "Theory of . . . for Transistors", pp.1535–1537, 1957.
Gibbons, et al. "Limited . . . Epitaxy", Appl. Phys. Lett. 47(7), Oct. 1985, pp. 721–723.

*Primary Examiner*—Jey Tsai
*Assistant Examiner*—Long Pham
*Attorney, Agent, or Firm*—Martin I. Finston

[57] ABSTRACT

A heterojunction bipolar transistor in an integrated circuit has intrinsic and extrinsic base portions. The intrinsic base portion substantially comprises epitaxial silicon-germanium alloy. The extrinsic base portion substantially comprises polycrystalline material, and contains a distribution of ion-implanted impurities. An emitter overlies the intrinsic base portion, and a spacer at least partially overlies the emitter. The spacer overhangs the extrinsic base portion by at least a distance characteristic of lateral straggle of the ion-implanted impurities.

13 Claims, 6 Drawing Sheets

METHOD FOR MAKING A HETEROJUNCTION BIPOLAR TRANSISTOR

This application is a continuation-in-part of application Ser. No. 08/419629, filed on Apr. 10, 1995 now abandoned, which provisional claims the benefit of U.S. application Ser. No. 60/008514, filed on Dec. 12, 1995.

FIELD OF THE INVENTION

This invention relates to silicon heterojunction bipolar transistors in which the base layer comprises silicon-germanium alloy, and to methods for manufacturing the same.

ART BACKGROUND

It is well recognized that silicon heterojunction bipolar transistors (HBTs) can be made to have advantageous properties of low noise and wide frequency response. This has been found particularly true of HBTs in which the silicon-germanium alloy base has a relatively high germanium fraction, i.e., about 30% or more, and a relatively high base doping level, i.e., about $5 \times 10^{19}$ cm$^{-3}$ or more. (Devices of this kind are described, e.g., in A. Schueppen, et al., *IEDM Tech. Digest* (1994) p. 377.) However, these devices are conventionally fabricated using blanket epitaxy on unpatterned substrates, followed by mesa isolation. Procedures of this kind are not compatible with advanced semiconductor fabrication processes that call for device structures having a greater degree of planarity.

SUMMARY OF THE INVENTION

We have found that by using, inter alia, the technique of rapid thermal epitaxy (RTE), we can make an HBT having a new, relatively planar structure that lends itself well to high-level integration using advanced fabrication processes.

Thus, in one aspect, our invention involves a method for making a silicon HBT. According to such method, a substantially single-crystalline silicon collector region is formed within a window defined in a layer of dielectric material. A SiGe alloy layer having a conductivity type opposite to the collector region is formed over the collector region and over at least a portion of the dielectric layer adjacent the collector region. This alloy layer is preferably formed by non-selective rapid thermal epitaxy (RTE), carried out in such a way that the resulting layer is substantially epitaxial where it overlies the collector region, but substantially polycrystalline where it overlies the dielectric layer. The part of the alloy layer that overlies the collector region is hereinafter referred to as the intrinsic part, and the part of the alloy layer that overlies the dielectric layer is hereinafter referred to as the extrinsic part. The terms intrinsic and extrinsic as so used refer only to the spatial arrangement of these parts, and not to their material composition. In further accordance with the inventive method, a silicon layer having the same conductivity type as the collector region is formed over the SiGe alloy layer by non-selective RTE, such that the resulting layer is substantially epitaxial where it overlies the collector region, but substantially polycrystalline where it overlies the dielectric layer, as in the case of the SiGe alloy layer below it. The respective epitaxial and polycrystalline parts of the silicon layer are referred to hereinafter as the intrinsic and extrinsic parts thereof, as in the case of the SiGe alloy layer. In further accordance with the inventive method, dopant species of the same conductivity type as the as-formed SiGe alloy layer are implanted into the extrinsic part of the alloy layer and the extrinsic part of the silicon layer, while being substantially excluded from the intrinsic parts of those layers. This implantation is carried out to a sufficient degree to produce in the extrinsic parts of the SiGe alloy layer and the silicon layer a doping level, of the same conductivity type as the as-formed SiGe alloy layer, that is greater than or equal to the doping levels in the collector region, the intrinsic part of the SiGe alloy layer, and the intrinsic part of the silicon layer.

BRIEF DESCRIPTION OF THE DRAWINGS

FIGS. 1–13 depict a sequence of steps in an exemplary fabrication process for making the transistor of FIG. 1.

DETAILED DESCRIPTION OF AN ILLUSTRATIVE EMBODIMENT

Figure 1:
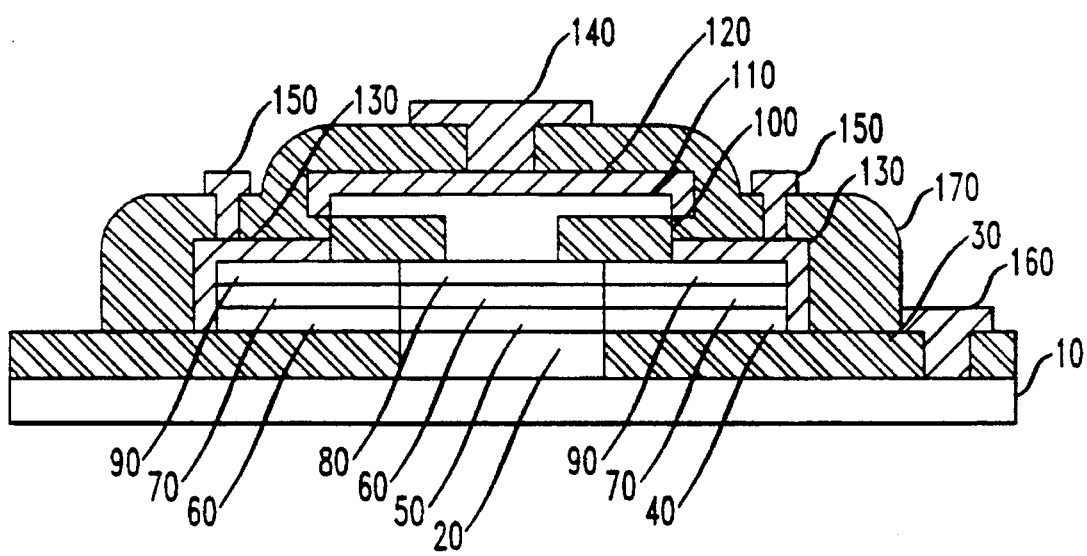
FIG. 1 depicts an exemplary transistor made according to the invention, in one embodiment.

One embodiment of the invention relates to the npn transistor illustrated in FIG. 1. However, the techniques described herein are readily adapted for the fabrication of pnp devices as well. Therefore our choice of an npn transistor for the following discussion is for purposes of illustration and is not intended to limit the scope of the invention.

A silicon substrate (not shown) has formed thereon at least one n+ subcollector region 10. Overlying a portion of region 10 is n-type collector region 20, laterally confined by insulating field oxide region 30. (Although region 30 typically comprises silicon dioxide, other dielectric materials, such as silicon nitride, can also be used.) A typical range of thicknesses for the collector region is 100–1000 nm. (The lower extreme is preferred in high-speed digital devices, and the higher extreme is preferred in power devices.) The collector region is exemplarily doped with arsenic, at a doping level that typically lies in the range $1 \times 10^{16}$ cm$^{-3}$ to $1 \times 10^{18}$ cm$^{-3}$. We currently prefer to reduce the doping level in the upper part of the collector region in order to increase the breakdown voltage of the resulting device. A thin silicon nucleation layer 40, 50 is formed over regions 20 and 30 in order to facilitate subsequent fabrication steps. When this layer is formed by non-selective RTE, the extrinsic portion 40, which overlies dielectric material forms as a substantially polycrystalline layer, whereas the intrinsic portion 50, which overlies single-crystalline silicon, forms as a substantially single-crystalline layer. Thin layer 40, 50 is effective as a seed layer for nucleating the growth of polycrystalline silicon on dielectric region 30, at least when formed to a thickness in the range 100–500Å. Generally, intrinsic portion 50 of the nucleation layer will function as part of the collector of the resulting device.

Intrinsic base 60 is formed over portion 50. The intrinsic base consists of epitaxial SiGe alloy, with a germanium mole fraction that lies, typically, in the range 5%–50% and is exemplarily 30%. The intrinsic base is doped in situ with a p-type dopant, exemplarily boron. The total thickness of the intrinsic base lies, typically, in the range 15–100 nm. At a given germanium mole fraction, it is desirable for this thickness to be at or below the equilibrium critical thickness for a capped SiGe layer having such germanium mole fraction.

As is well known to practitioners in the field of silicon IC fabrication, the lattice constant of SiGe is different from the lattice constant of pure silicon. Nevertheless, if it is thin enough, it is possible to grow on silicon a layer of SiGe that is strained such that the lattice parameters parallel to the interface are equal. That is, the lattice misfit can be accommodated by elastic strain so long as the thickness of the SiGe layer is less than the critical thickness. Critical thicknesses are described, e.g., in J. C. Bean et at., "$Ge_xSi_{1-x}$/Si Strained-Layer Superlattice Grown by Molecular Beam Epitaxy," *J. Vac. Sci. Technol. A*2 (1984) 436–440, and "Determination of the Critical Layer Thickness of $Si_{1-x}Ge_x$/Si Heterostructures by Direct Observation of Misfit Dislocations," *App. Plys. Lett.* 52 (Feb. 1988) 380–382.

We currently prefer to enclose the doped layer between a pair of undoped spacer layers of the same germanium mole fraction. Exemplarily, a 10-nm doped region is enclosed between 4-nm spacer layers. The resulting total thickness of 18 nm is below the equilibrium thickness, as noted above, for a germanium mole fraction of 30%.

The doping of the intrinsic base, which generally imparts p+ conductive behavior, is typically at a level lying in the range $1\times10^{18}$ cm$^{-3}$ to $2\times10^{20}$ cm$^{-3}$. We currently prefer to employ a doping profile in the doped layer that ranges from $5\times10^{18}$ cm$^{-3}$ to $2.5\times10^{19}$ cm$^{-3}$. (The peak doping concentration lies approximately at the center of this profile.) Formed continuously with intrinsic base 60 is extrinsic part 70 of the SiGe layer in which the intrinsic base is defined. When this layer is deposited by non-selective RTE, the extrinsic part, which is deposited on polycrystalline silicon region 40, also forms as substantially polycrystalline material.

Formed on intrinsic base 60 is emitter 80, which consists of n-type single-crystalline silicon. Formed continuously with emitter 80 is extrinsic part 90 of the silicon layer in which emitter 80 is defined. When this layer is deposited by non-selective RTE, the extrinsic part, which is deposited on polycrystalline SiGe region 70, also forms as substantially polycrystalline material.

The extrinsic parts 40, 70, and 90 are doped with a p-type dopant by ion implantation. We typically dope to a doping level at least as great as that of (p-type) intrinsic base 60, and at least as great as (n-type) emitter 80. A typical range for this doping level is $1\times10^{19}$ cm$^{-3}$ to $5\times10^{20}$ cm$^{-3}$, and is exemplarily $2.5\times10^{19}$ cm$^{-3}$. The result of this implantation step is to define an extrinsic base region that comprises parts 40, 70, and 90. Thus, it will be apparent that this extrinsic base region substantially comprises polycrystalline silicon (in parts 40 and 90) and polycrystalline SiGe (in part 70), and that respective layer-like portions 40, 70, and 90 of the extrinsic base region are formed continuously with corresponding elements 50, 60, and 80.

Figure 2:
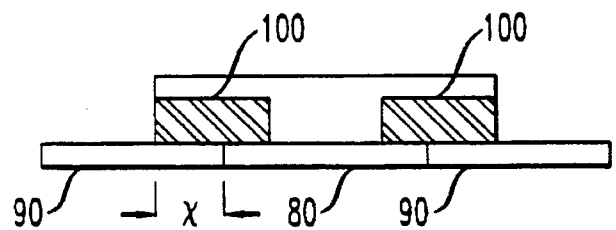
FIG. 2 is a detail of the transistor of FIG. 1, showing how overhang length x is defined.
Figure 3:
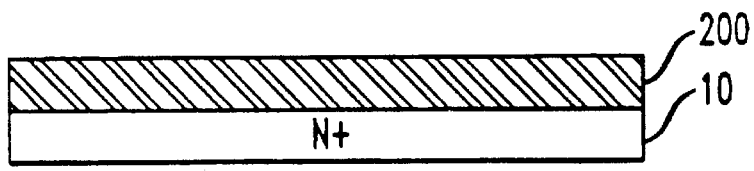

Significantly, emitter 80 is overlain by dielectric spacer 100, which is typically TEOS-deposited silicon dioxide, exemplarily 300 nm in thickness. As shown in FIG. 2, spacer 100 is advantageously formed so as to overhang extrinsic part 90 by an overhang length x. We have found that the performance of the resulting transistor is sensitive to the distribution of implanted extrinsic base dopant species. Specifically, we have observed the following effects:

1. When implantation takes place into single-crystalline material (i.e., in the intrinsic parts), mobile point defects can diffuse in the lateral direction, and induce intrinsic base dopant species (particularly boron) to diffuse past the heterojunctions that separate the intrinsic base from collector 20 and emitter 80. This causes the injection efficiency (and thus the collector current) of the resulting transistor to decrease. By contrast, when implantation takes place substantially within the polycrystalline (i.e., extrinsic) material, the implantation damage tends to remain within such material and the integrity of the intrinsic base is substantially preserved.

2. The implantation step leads to the formation of a p-n junction between the extrinsic base and the emitter. When implantation takes place substantially within polycrystalline material, this junction, as initially formed, also lies within polycrystalline material. However, such a location for the p-n junction leads to relatively high recombination currents, which tend to increase the base cttrrent. By contrast, the base current tends to be smaller when the implant extends into the intrinsic regions, and the p-n junction is thus formed within single-crystalline material.

3. The collector-base capacitance ($C_{BC}$) tends to be greater when the p-n junction is formed in polycrystalline material rather than in single-crystalline material. A contemplated explanation would ascribe this effect to a thin depletion region created by electrically active defect sites associated with the polycrystalline grain boundaries.

The first of these three effects militates for an implantation step that is performed in such a way as to block the implanted impurity species from stopping within the intrinsic regions. This blocking function is performed by spacer 100. Specifically, overhang length x is chosen to be sufficient to substantially block the implanted species from stopping within elements 60 and 80 as a result of either direct implantation or lateral straggle. (It is thus apparent that x must be at least equal to a characteristic distance of lateral straggle.) In this context, we regard such blocking as "substantial" if the greatest concentration of implanted species that is formed within element 60 or element 80 is no more than 1% of the peak doping level in the extrinsic base. For typical implantation conditions, we have found that the overhang length advantageously lies in the range 150 nm–400 nm (assuming a BF$_2$ implant at 30 keV at a flux of $1\times10^{15}$ cm$^{-2}$ and a B implant at 60 keV and $2\times10^{15}$ cm$^{-2}$. An exemplary such length is 200 nm.

It will be apparent that the second and third of the effects discussed above militate for forming the aforesaid p-n junction within single-crystalline material, or at least at the interface between the polycrystalline and the single-crystalline material. As we discuss in greater detail below, we have found it advantageous to initially form the p-n junction within the polycrystalline material at an offset distance from the aforesaid interface, and then to allow the junction to move to the interface by thermal diffusion within a carefully specified temperature range.

Emitter 80 is partially overlain by lower emitter contact 110. An emitter contact layer is conveniently made by a shallow implant of impurity species, exemplarily arsenic, in the upper portion of the emitter. However, we have found that point defects resulting from such an implantation process can migrate to the intrinsic base, and there activate the out-diffusion of boron dopant. Therefore, contact 110 is advantageously made by depositing in-situ-doped polycrystalline silicon within a window defined in spacer 100. This contact is exemplarily 140 nm thick, and is exemplarily doped with arsenic at a concentration of about $5 \times 10^{20}$ cm$^{-3}$.

Emitter upper contact layer 120 overlies emitter lower contact layer 110, and base contact layer 130 overlies portion 90 of the extrinsic base. Contact layers 120 and 130 are advantageously made from titanium disilicide, according to a self-aligned process to be described below. Emitter electrode 140, base electrode 150, and collector electrode 160 are exemplarily formed of aluminum, 1% copper alloy 1000 nm in thickness in contact holes defined in silicon dioxide isolation layer 170.

With reference to FIGS. 3–13, we now describe a sequence of fabrication steps that is useful for making a transistor of the kind described above.

The transistor is formed, in part, by growing a sequence of semiconductor layers. These are grown by rapid thermal epitaxy (RTE) using the mode of growth known as limited reaction processing. (This growth mode is described, e.g., in J. F. Gibbons et al., Appl. Phys. Lett. 47 (1985) p. 721.) Hydrogen is used as the carrier gas for each step in the growth sequence. (RTE is epitaxial growth by chemical vapor deposition, using high-intensity radiant heat for fast adjustment of the growth temperatures.)

Figure 4:
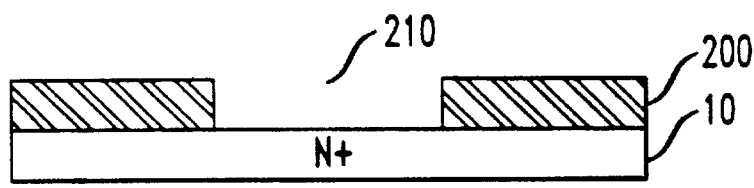
Figure 5:
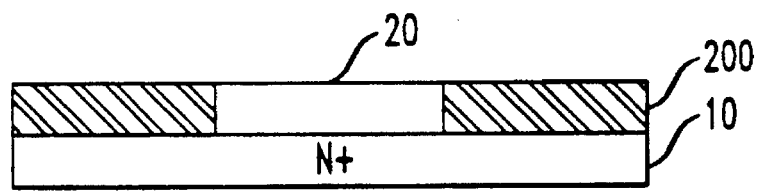
Figure 6:
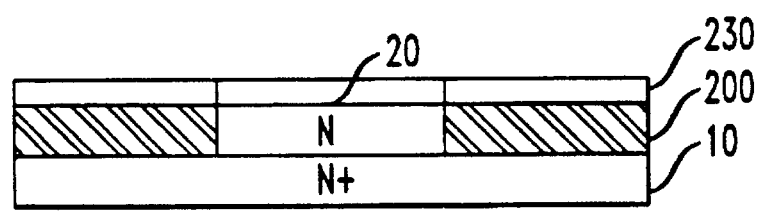
Figure 7:
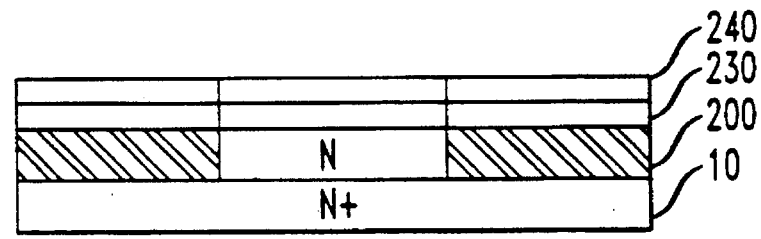

First, oxide layer 200 is conventionally formed on subcollector 10. Next, as shown in FIGS. 4 and 5, window 210 is conventionally opened in layer 200, and collector 20 is grown in the window, on subcollector 10, by selective epitaxial growth (SEG) with in-situ arsenic doping. This growth is performed in a flow mixture of dichlorosilane, hydrogen chloride, and arsine, typically at 800° C.–1000° C., exemplarily at 950° C. (Faster growth is achievable at still higher temperatures, but this could expose other structures on the wafer to a thermal budget that is disadvantageously high.) Then, as shown in FIG. 6, silicon layer 230 is grown to facilitate the subsequent growth of the SiGe base and the emitter. Layer 230 is grown from silane. Portion 231 of layer 230 (i.e., the extrinsic portion) is grown on oxide, and forms as a polycrystalline layer. Portion 232 of layer 230 (i.e., the intrinsic portion) is grown on single-crystalline silicon, and forms as an epitaxial layer. Next, SiGe base layer 240 is grown, as shown in FIG. 7. This layer is grown from dichlorosilane, germane, and, for boron doping, diborane. Like the preceding layer, layer 240 forms as polycrystalline material in extrinsic portion 241 thereof, which overlies portion 231 of the preceding layer, and forms epitaxially in intrinsic portion 242 thereof, which overlies portion 232 of the preceding layer.

Figure 8:
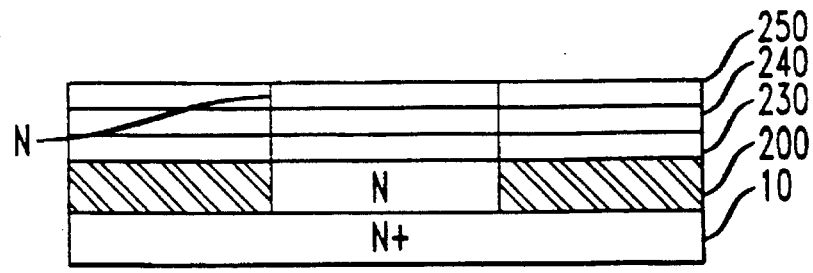

Next, silicon layer 250 is grown, as shown in FIG. 8. This layer (the intrinsic portion of which is destined to become the emitter) is grown from dichlorosilane and arsine to an exemplary thickness of 150 nm, at an exemplary temperature of 800° C., at an exemplary doping level of $3 \times 10^{18}$ cm$^{-3}$. It is desirable in the growth of layer 250 to keep the growth temperature below about 825° C. in order to avoid mobilizing the boron doped into layer 240. As in the case of the preceding two layers, layer 250 is polycrystalline in extrinsic portion 251 thereof, and epitaxial in intrinsic portion 252 thereof.

Figure 9:
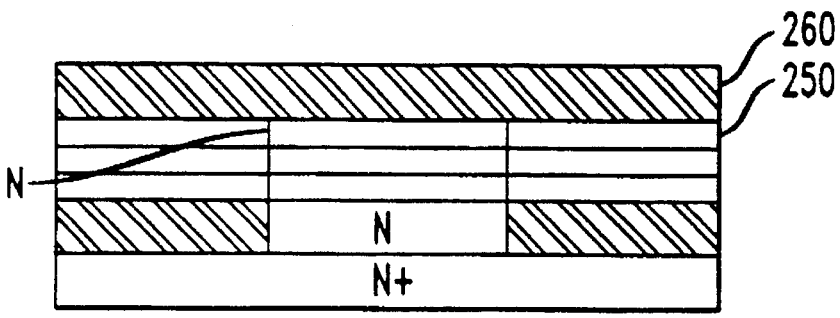
Figure 10:
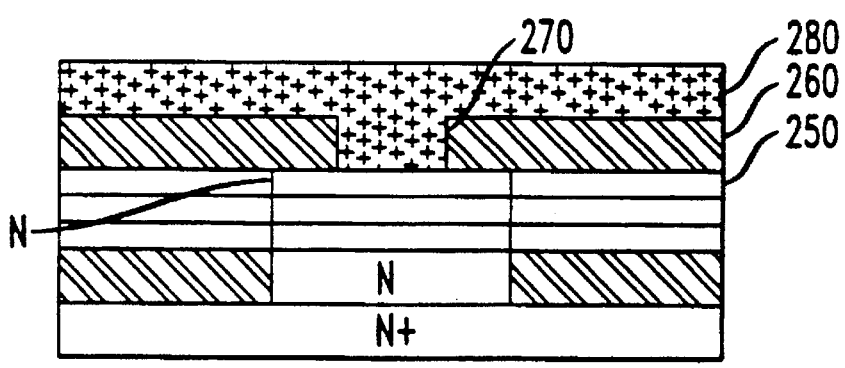

Next, as shown in FIG. 9, silicon dioxide layer 260, exemplarily 300 nm thick, is formed by plasma-enhanced chemical vapor deposition from TEOS, typically in a PETEOS reactor. As shown in FIG. 10, emitter window 270 is opened in layer 260 by reactive ion etching, and polycrystalline silicon layer 280 is deposited, filling window 270. We have found it convenient to form layer 280 in our RTE reactor. Layer 280, which is destined to become emitter lower contact layer 110 (see FIG. 1) is gown from silane and arsine (the latter for in-situ doping) to an exemplary thickness of 140 nm at an exemplary growth temperature of 700° C.

Figure 11:
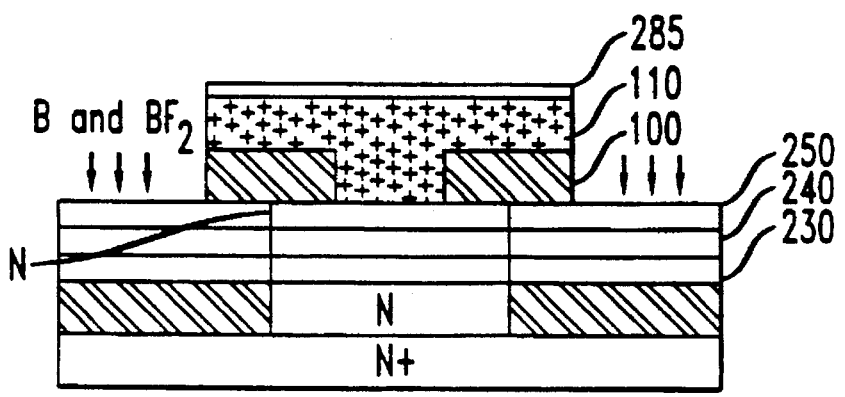

Next, layers 260 and 280 are patterned, as shown in FIG. 11, by a resist process followed by etching. This leads to formation of emitter lower contact 110 and spacer 100 (as also shown in FIG. 1 ). With resist 285 still in place, the extrinsic base implantation is performed, as described below. Then, the device is isolated by performing a further lithographic patterning step, followed by etching of layers 230, 240, and 250. The resulting structure is shown in FIG. 12.

Figure 12:
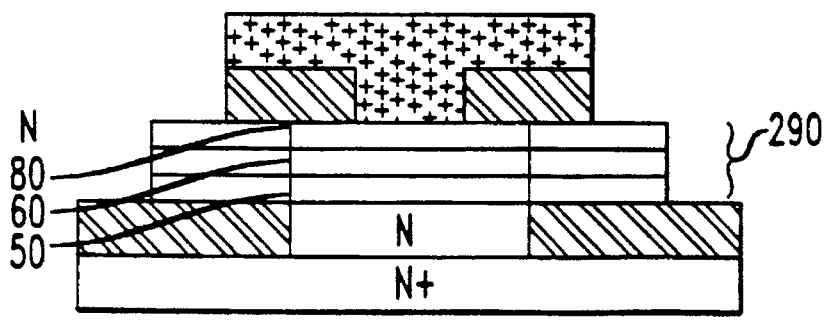

With further reference to FIGS. 11 and 12, extrinsic base region 290 is formed, as noted above, by ion implantation of boron and boron difluoride into layers 230, 240, and 250. During this implantation, spacer 100 blocks ions from implantation within the intrinsic portions of these layers. As noted, and as best illustrated in FIG. 2, it is desirable for spacer 100 to overhang extrinsic layer portion 251 by at least a characteristic distance of lateral straggle such that the implantation does not result in substantial stopping of implanted species within the intrinsic regions. Exemplary implantation energies and fluxes for this step are, respectively: for boron difluoride, 30 keV and $10^{15}$ cm$^{-2}$, and for boron, 60 keV and $3 \times 10^{15}$ cm$^{-2}$.

For the illustrative implant conditions, we found that overhang lengths of 150–400 nm are useful, and in at least some cases in which the as-implanted p-n junction is not to be moved by thermal diffusion, it is advantageous to have an overhang of about 200 nm. At implant energies of 10–100 keV, the perpendicular straggle length of boron ranges from about 19 nm to about 87 nm in small-grain-size polycrystalline silicon. At the illustrative implant energy of 60 keV, this straggle length is about 60 nm. (For a discussion of straggle lengths, see, e.g., S. M. Sze, *VLSI Technology*, McGraw-Hill, New York, 1983, pp. 232–233.) It should be noted that because the straggle phenomenon does not have a sharp cutoff, a small but significant concentration of implanted species will typically extend beyond the straggle length.

Figure 13:
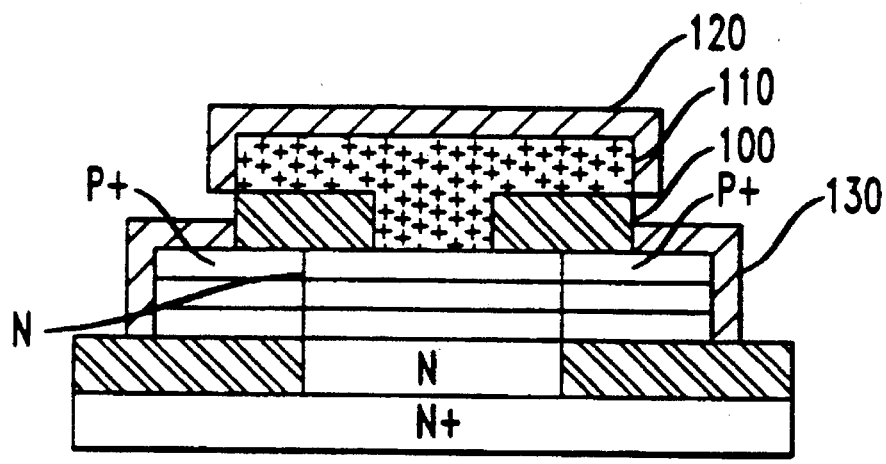

Next, as shown in FIG. 13, emitter upper contact layer 120 and base contact layer 130 are formed in a self-aligned manner by growing a titanium disilicide layer in a two-step, rapid thermal annealing process, which is exemplarily performed at 640° C. for 60 s, and then at 800° C. for 40 s. This anneal is exemplarily performed in nitrogen at atmospheric pressure, flowing at 5 liters/min. This thermal cycle is also effective for activating the implanted boron dopant in the extrinsic base.

Turning back to FIG. 1, oxide layer 170 is formed by, exemplarily, a PETEOS process to an exemplary thickness of 300 nm and patterned according to conventional methods to provide contact holes for the electrodes. Electrodes 140, 150, and 160 are then formed by conventional metal deposition, followed by conventional, reactive-ion etching through a patterned, tri-level resist. An exemplary sequence of metal depositions to form the electrodes is: titanium, 30 nm; titanium nitride, 60 nm; aluminum-copper alloy (500–1000 nm).

Figure 14:
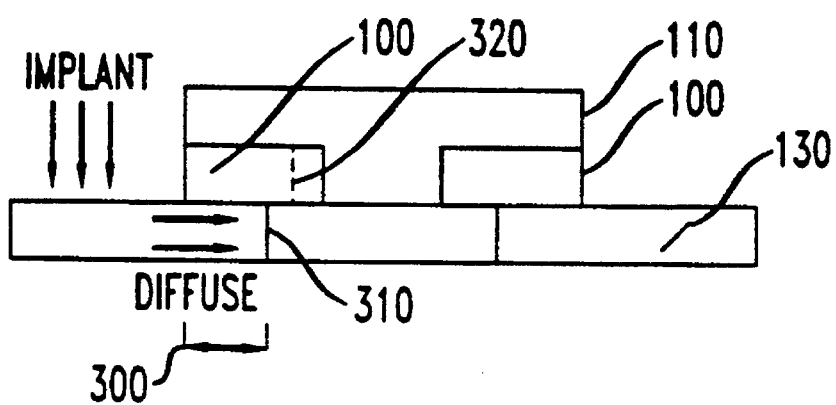
FIG. 14 illustrates the step, according to one embodiment of the invention, of diffusing implanted base dopant species toward the interface between polycrystalline and single crystalline material.

FIG. 14 illustrates formation of the extrinsic base by ion implantation at an offset distance 300, followed by thermal diffusion to shift the location of the resulting p-n junction to interface 310 between the intrinsic and extrinsic regions. (Structural elements described in reference to previous figures are denoted by like reference numerals.) As previously mentioned, this procedure may be advantageous for reducing junction capacitance and recombination, while preserving the integrity of the dopant distribution in the intrinsic base. This thermal diffusion is performed, before or after forming titanium disilicide layers 120 and 130, as described below. If this thermal diffusion is performed, it is advantageously carried out so as to shift the location of the p-n junction a short distance into the single-crystalline region. For example, the diffusion advantageously results in an implanted (and diffused) dopant profile that falls from a peak value at the interface to 10% of the peak value at a depth of about 500 Å or less, and preferably about 200Å or less, within the single-crystalline region.

We currently prefer to perform this diffusion before forming layers 120 and 130. That is because titanium disilicide is believed to have a relatively high affinity for boron, and therefore if layer 130 is present during the diffusion, it may behave as a diffusive sink for boron from the extrinsic base.

Figure 15:
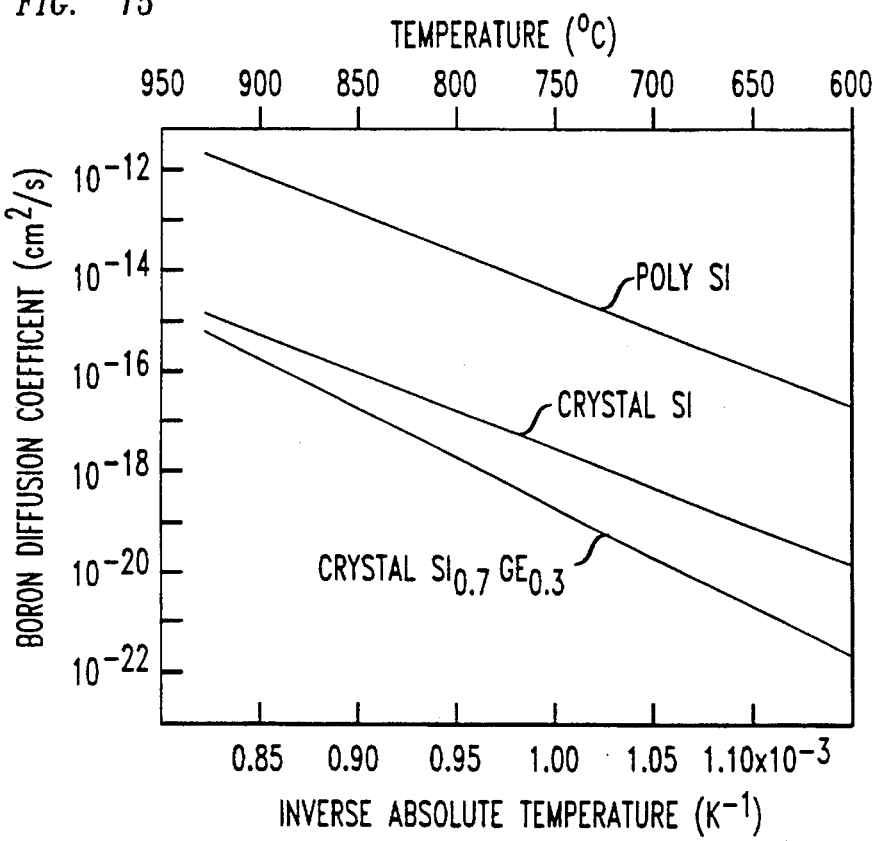
FIG. 15 is a graph of the diffusion coefficient of boron in various materials as a function of temperature. This graph makes it convenient to compare boron diffusion in polycrystalline silicon, single-crystalline silicon, and single-crystalline silicon-germanium alloy (30% germanium mole fraction).

Significantly, the activation energy of boron diffusion in SiGe (30% germanium) is 4.4 eV, whereas in polycrystalline silicon it is only 2.5 eV. We have found that this makes it possible to select a practical temperature for diffusion of implanted boron in the extrinsic base that leads to no substantial boron diffusion within the intrinsic base. Inspection of FIG. 15 shows that such practical temperatures lie in the range from about 650° C. to about 850° C. We currently prefer a temperature of about 700° C., because at this temperature, the desired diffusion in polycrystalline silicon takes place within a convenient period of time (typically 3 hours), whereas the boron diffusion coefficient at this temperature in the single-crystalline SiGe is more than five orders of magnitude smaller than in the polycrystalline silicon. One advantage of such large disparities in diffusion coefficient between the two respective materials is that this diffusion process is inherently self-limiting. That is, the diffusion front propagates to the interface with the single-crystalline material, but does not propagate further, to any significant degree, in any subsequent time period comparable to the elapsed diffusion time up to that point. Thus, even when limited by the reaction time of a human operator and by the thermal response time of the reactor, it is possible to reliably place the resulting p-n junction within, e.g., 50 nm of the aforesaid interface.

EXAMPLE

We made a series of transistors substantially as described above. We did not perform a heat treatment to redistribute implanted boron within the extrinsic base. Thus, in each instance, the implanted dopant distribution in the extrinsic base was determined by the spacer overhang length x. Within this series, the overhang length was varied from an overhang of 300 nm to a setback of 300 nm. (By a "setback" is meant that the spacer edge lay over the intrinsic, and not the extrinsic region. Such an edge is indicated as edge 320 in FIG. 14.) In each instance, the emitter dimensions were 0.5 μm×10 μm, and the collector dimensions were 1.5 μm×11 μm.

Figure 16:
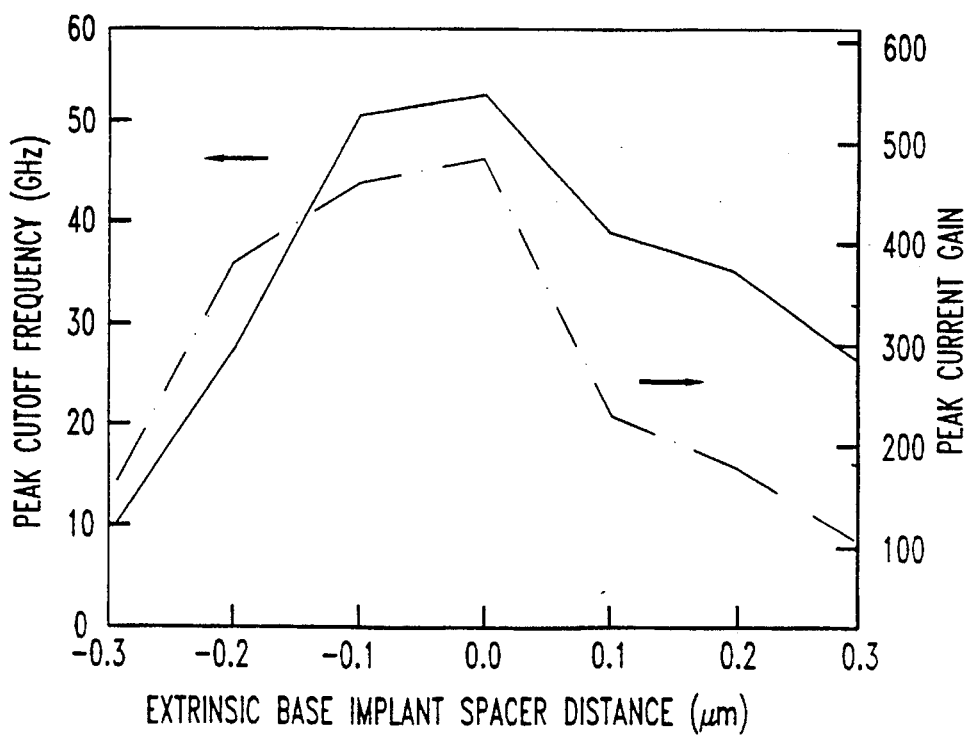
FIG. 16 is a graph showing how the performance of the transistor of FIG. 1 is affected by changes in the overhang length x of FIG. 2. The performance figures of merit represented on the graph are the peak cutoff frequency and the peak current gain.

FIG. 16 shows how the overhang length affected the peak cutoff frequency and the peak current gain in the aforesaid series of transistors. It should be noted that in the figure, negative values of the overhang length correspond to an overhang that extends above the polycrystalline region, and positive values of the overhang length correspond to a setback as indicated, e.g., by edge 320 in FIG. 14.

It is evident from FIG. 16 that the cutoff frequency steeply rises from about 10 Ghz to more than 50 Ghz as the extrinsic base-implant position moves closer to the interface between polycrystalline and single-crystalline material. We attribute this rise to a decrease in junction capacitance. However, as the implant position progresses past the aforesaid interface, both the peak cutoff frequency and the peak current gain decrease. We attribute this decrease to a rise in the concentration of point defects (probably silicon interstitials) caused by implant damage. The presence of these defects is believed to increase boron out-diffusion from the intrinsic base, and to increase the base transit time.

Figure 17:
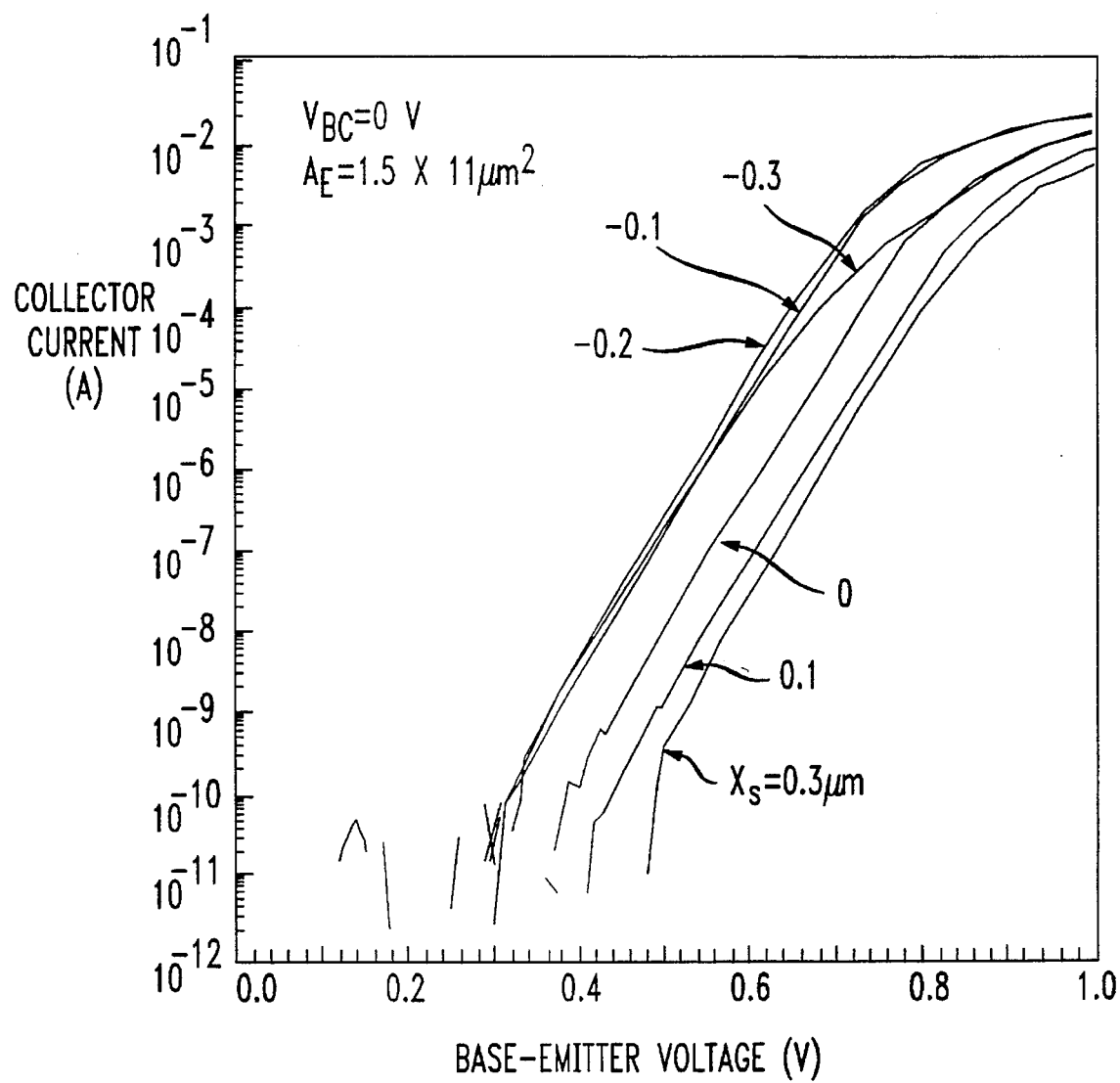
FIG. 17 is a graph of collector current as a function of base-emitter voltage at various values of the overhang length x in the transistor of FIG. 1.

FIG. 17 shows how collector current varied with the location of the spacer edge. When implantation was confined to polycrystalline material (negative values of x), injection efficiency was enhanced and collector current increased. The figure shows an improvement even for overhang lengths smaller than 100 nm and for overhang lengths greater than 300 nm.

The invention claimed is:

1. A method for forming a heterojunction bipolar transistor, comprising:
    a) forming a substantially single-crystalline silicon collector region of a first conductivity type within a window defined in a layer of dielectric material;
    b) over the collector region and over at least a portion of the dielectric layer adjacent the collector region, forming a silicon nucleation layer by non-selective rapid thermal epitaxy and then forming a silicon-germanium alloy layer of a second conductivity type opposite to the first conductivity type by non-selective rapid thermal epitaxy, such that each resulting layer has a part to be referred to as intrinsic that overlies the collector region and a part to be referred to as extrinsic that overlies the dielectric layer, and such that each resulting layer is substantially epitaxial in the intrinsic part thereof and substantially polycrystalline in the extrinsic part thereof;
    c) over the alloy layer, forming a silicon emitter layer of the first conductivity type by non-selective rapid thermal epitaxy, such that the resulting emitter layer comprises a substantially epitaxial part that overlies the collector region and a substantially polycrystalline part that overlies the dielectric layer, said parts to be respectively referred to as intrinsic and extrinsic parts of said emitter layer; and
    d) implanting dopant species of the second conductivity type into the extrinsic parts of at least the alloy layer and the emitter layer while substantially excluding said species from the intrinsic parts of the alloy layer and emitter layer, wherein
    e) the implanting step leads to a doping level of the second conductivity type in both the extrinsic part of the alloy layer and the extrinsic part of the emitter layer.

2. The method of claim 1, wherein the collector region is formed by selective epitaxial growth.

3. The method of claim 1, further comprising, before the implanting step, forming a dielectric spacer that at least partially overlies the intrinsic part of the emitter layer and partially overhangs the extrinsic part of said layer, such that during the implanting step, the dopant species are substantially excluded by the spacer from stopping within the intrinsic parts of the emitter layer, the alloy layer, and the nucleation layer.

4. The method of claim 3, further comprising, after the implanting step, performing an annealing step such that a substantial concentration of dopant species implanted in at least the emitter layer and the nucleation layer is laterally diffused toward the intrinsic parts of said emitter and nucleation layers.

5. The method of claim 4, wherein said annealing step is carried out such that said substantial concentration of dopant species implanted in the emitter layer and the nucleation layer is laterally diffused into the intrinsic part of each said emitter and nucleation layers to a depth of about 500 Å or less.

6. The method of claim 4, wherein said annealing step is carried out such that said substantial concentration of dopant species implanted in the emitter layer and the nucleation layer is laterally diffused into the intrinsic part of each said emitter and nucleation layers to a depth of about 200 Å or less.

7. The method of claim 4, wherein said annealing step is carried out at a temperature low enough to preclude substantial out-diffusion of second-conductivity-type dopant from the intrinsic part of the alloy layer.

8. The method of claim 4, wherein the alloy layer is doped in situ with boron as it is formed, and said annealing step is carried out at a temperature low enough to preclude substantial out-diffusion of said in-situ-doped boron from the intrinsic part of the alloy layer.

9. The method of claim 7, wherein the annealing temperature lies in the range 650° C. to 850° C.

10. The method of claim 3, wherein the alloy layer is doped in-situ with boron as it is formed; the implanted dopant species comprise boron; and the method further comprises forming an emitter contact layer by depositing in-situ arsenic-doped polycrystalline silicon on the intrinsic part of the emitter layer.

11. The method of claim 9, further comprising forming self-aligned titanium disilicide layers on the extrinsic part of the emitter layer and on the emitter contact layer, wherein:

said titanium-disilicide-forming step comprises annealing at one or more annealing temperatures; and said annealing temperature or temperatures are selected to be great enough to activate the boron implanted in the extrinsic part of the alloy layer, but low enough to preclude substantial diffusion of in-situ-doped boron from the intrinsic part of the alloy layer.

12. The method of claim 3, wherein the spacer-forming step results in an overhang by the spacer of the extrinsic part of the emitter layer by at least a distance characteristic of the lateral straggle of the implanted dopant species.

13. The method of claim 3, wherein the spacer-forming step results in an overhang by the spacer of the extrinsic part of the emitter layer by a distance that is not less than about 150 nm, and not more than about 400 nm.

* * * * *